(12) United States Patent
Tregub et al.

(10) Patent No.: US 7,314,667 B2
(45) Date of Patent: Jan. 1, 2008

(54) PROCESS TO OPTIMIZE PROPERTIES OF POLYMER PELLICLES AND RESIST FOR LITHOGRAPHY APPLICATIONS

(75) Inventors: Alexander Tregub, Oak Park, CA (US); Florence Eschbach, Portola Valley, CA (US); Fu-Chang Lo, Palo Alto, CA (US); Susan M. Holl, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 10/799,435

(22) Filed: Mar. 12, 2004

(65) Prior Publication Data

US 2005/0203254 A1 Sep. 15, 2005

(51) Int. Cl.
*B32B 27/16* (2006.01)
*B32B 27/28* (2006.01)

(52) U.S. Cl. ..................... 428/421; 428/422
(58) Field of Classification Search ............... 428/421, 428/422; 525/326.2, 326.4; 427/525, 569
See application file for complete search history.

(56) References Cited

U.S. PATENT DOCUMENTS

| 4,060,654 | A | | 11/1977 | Quenneville |
| 4,296,151 | A | | 10/1981 | Boultinghouse |
| 4,737,387 | A | | 4/1988 | Yen |
| 4,743,493 | A | * | 5/1988 | Sioshansi et al. ............ 428/217 |
| 5,041,304 | A | * | 8/1991 | Kusano et al. .............. 427/535 |
| 5,378,514 | A | | 1/1995 | Hamada et al. |
| 5,643,654 | A | | 7/1997 | Fujita et al. |
| 5,693,382 | A | | 12/1997 | Hamada et al. |
| 5,723,860 | A | | 3/1998 | Hamada et al. |
| 5,880,204 | A | | 3/1999 | McCarthy et al. |
| 5,958,524 | A | * | 9/1999 | Dehennau et al. .......... 427/533 |
| 6,055,040 | A | | 4/2000 | Sego |
| 6,083,577 | A | | 7/2000 | Nakagawa et al. |
| 6,111,062 | A | * | 8/2000 | Shirota et al. .............. 528/402 |
| 6,300,019 | B1 | | 10/2001 | Ikeda et al. |
| 6,436,586 | B1 | | 8/2002 | Matsuoka et al. |
| 6,459,491 | B1 | | 10/2002 | Nguyen |
| 6,524,754 | B2 | | 2/2003 | Eynon |
| 6,548,129 | B2 | | 4/2003 | Matsukura et al. |
| 6,639,650 | B2 | | 10/2003 | Shirasaki |
| 6,652,958 | B2 | | 11/2003 | Tobita |
| 6,822,731 | B1 | | 11/2004 | Laganza et al. |
| 6,841,312 | B1 | | 1/2005 | Kalk |
| 6,842,227 | B2 | | 1/2005 | Shu |
| 6,842,228 | B2 | | 1/2005 | Shu |
| 6,869,733 | B1 | | 3/2005 | Su |
| 2001/0004508 | A1 | | 6/2001 | Shirasaki |
| 2001/0014375 | A1 | | 8/2001 | Tanaka |
| 2002/0136965 | A1 | | 9/2002 | Tsumoto et al. |
| 2002/0179852 | A1 | | 12/2002 | Zheng et al. |
| 2003/0096178 | A1 | | 5/2003 | Fujita et al. |
| 2003/0187168 | A1 | * | 10/2003 | Sunaga et al. .............. 526/250 |
| 2003/0192567 | A1 | | 10/2003 | Koizumi et al. |
| 2004/0123950 | A1 | | 7/2004 | Boyd |
| 2005/0045262 | A1 | | 3/2005 | Eschbach et al. |
| 2005/0048376 | A1 | | 3/2005 | Eschbach et al. |
| 2005/0202252 | A1 | | 9/2005 | Tregub et al. |

FOREIGN PATENT DOCUMENTS

| EP | 0 252 673 | 1/1988 |
| EP | 0 416 528 | 3/1991 |
| EP | 0 438 602 | 7/1991 |
| EP | 0 529 827 | 3/1993 |
| EP | 0 942 325 | 9/1999 |
| JP | 09-005982 | 1/1997 |
| WO | WO93/24559 | 12/1993 |
| WO | 2005/022259 | 3/2005 |

OTHER PUBLICATIONS

K.R. Walton, "The Lubrication of Gold Surfaces by Plasma-Deposited Thin Films of Fluorocarbon Polymer," IEE Transactions on Components, Hybrids, and Manufacturing Technology, v. CHMT-No. 2, 1980.
Karis et al., "Characterization of a Solid Fluorocarbon Film on Magnetic Recording Media," J. Vac. Technol., A 15(4), 1997.
Karis et al., "Tribology of a Solid Flurocarbon Film on Magnetic Recording Media," IEEE Transaction on Magnetics, V. 34, No. 4, 1998.
Theirich et al., "A Novel Technique for High rate Plasma Polymerization with Radio Frequency Plasmas," Surface and Coating Technology 86-87, 1996.
P. Singer, "Atomic Layer Deposition Targets Thin Films," Semiconductor International, Sep. 1, 1999.
Mark LaPedus "Nikon Evaluating 157-nm Lithography Options," Semiconductor Business News, May 23, 2003.

(Continued)

*Primary Examiner*—Ramsey Zacharia
(74) *Attorney, Agent, or Firm*—Fish & Richardson P.C.

(57) ABSTRACT

Disclosed are pellicle compositions and methods of making such pellicle compositions. The pellicle compositions provided include highly fluorinated polymers as well as fluorinated polymer/PVDF co-polymers.

15 Claims, 8 Drawing Sheets

OTHER PUBLICATIONS

Resrick & Bucks, "Teflon AF Amophous Flouropolymers." Chapter 22 in Modern Fluoropolymers, Edited by J. Schews, Jon Wiley & Sons, 1997.

Sugiyama, "Perfluoropolymers Obtained by Cyclopolymerization and Their Applications," Chapter 28 in Modern Fluoropolymers, Edited by J. Schews, Jon Wiley & Sons, 1997.

Seki et al., Phys. Suripta 41:167(1990)).

Chen, et al., "Pellicle-Induced Reticle Distortion: An Experimental Investigation", Proc. of SPIE—The Int'l Soc. for Optical Engineering, vol. 3546, pp. 167-172 (1998).

Cotte, et al., "Effects of Soft Pellicle Frame Curvature and Mounting Process on Pellicle-Induced Distortions in Advanced Photomasks", Proc. of SPIE—The Int'l Soc. for Optical Engineering, vol. 5040, pp. 1044-1054 (2003).

Cotte, et al., "Experimental and Numerical Studies of the Effects of Materials and Attachment Conditions on Pellicle-Induced Distortions in Advanced Photomasks", Proc. of SPIE—The Int'l Soc. for Optical Engineering, vol. 4754, pp. 579-588 (2002).

Cotte, et al., "Numerical and Experimental Studies of Pellicle-Induced Photomask Distortions", Proc. of SPIE—The Int'l Soc. for Optical Engineering, vol. 4562, pp. 641-651 (2002).

Kozeki, T., et al., "Longevity of 193nm/ArF Excimer Pellicle", Mitsui Chemicals, Inc., Pellicle Dept., pp. 1-17 (2001).

Oshima, et al., "Chemical structure and physical properties of radiation-induced crosslinking of polytetrafluoroethylene", Radiation Physics and Chemistry, vol. 62, pp. 39-45 (2001).

Reu, et al., "Mechanical analysis of hard pellicles for 157 nm lithography", Proc. of the 2001 SPIE Symp. on Optical Microlithography XIV, vol. 4346, 9 pages (2001).

Shu, et al., "Hard Pellicle Study for 157-nm Lithography", Preprint, to appear in the Proceedings of Photomask Japan, pp. 1-12 (2002).

Van Krevelen, D.W., with the collaboration of P.J. Hoftyzer, Properties of Polymers, Their Estimation and Correlation with Chemical Structure, Elsevier Scientific Publishing Company, Amsterdam—Oxford—New York, pp. 68-73 (1976).

Allinger, Norman, et al., Organic Chemistry, Worth Publishers, Inc., 1971, p. 674.

Hawley's Condensed Chemical Dictionary, 13th Ed., Revised by Richard J. Lewis, Sr., John Wiley & Sons, Inc., New York, NY, 1997, p. 297.

Webster's II New Riverside University Dictionary, Houghton Mifflin Company, 1988, p. 310.

* cited by examiner

PELLICLE FILM THINNING TEST

PROCESS TO OPTIMIZE PROPERTIES OF POLYMER PELLICLES AND RESIST FOR LITHOGRAPHY APPLICATIONS

TECHNICAL FIELD

The disclosure relates to polymers, and more particularly to polymers useful as pellicles in photolithography.

BACKGROUND

Pellicles are membranes used during lithography. A pellicle is placed a desired distance from either the front side or the backside of a mask. Pellicles may be used to block particles that are in the focal plane from reaching the mask or reticle surface. Any particles on the pellicle surface are out of the focal plane and hence should not form an image on the wafer being exposed. A pellicle is a thin transparent layer stretched over a frame above the surface of a mask or reticle. Typically the pellicle is transparent to laser light. Applied laser energy will depend on pellicle and resist transmission. For example, critical dimensions of the printed resist features are very sensitive to the variation dose of laser energy. A 2% difference in dose can result in 10% variation in critical dimensions.

DETAILED DESCRIPTION

The use of 157 nm wavelength irradiation has proven important in some photolithography techniques. CYTOP shows poor transmissibility and durability when used at shorter wavelengths (e.g., 157 nm). This disclosure provides pellicle materials having improved durability and transmissibility at 157 nm wavelength irradiation.

Pellicles are used as a photomask protective cover in the projection printer or wafer/mask stepper process to increase the yield of the process. The pellicle is a thin transparent membrane adhered to a frame, which guards a photomask or reticle from harmful particle contamination.

In the lithographic industry, ultraviolet rays of wavelengths: 248 nm and 193 nm are used as exposure light, and with fining of patterns. Far-ultraviolet rays, vacuum ultraviolet rays, electron beam (EB), X-rays, and the like, which have shorter wavelengths, have been used as exposure lights. KrF excimer laser beams having wavelengths of 248 nm, ArF excimer laser beams having wavelengths of 193 nm, and F2 laser beams having wavelengths of 157 nm are being used and are expected to be useful for the formation of fine patterns.

Figure 1:
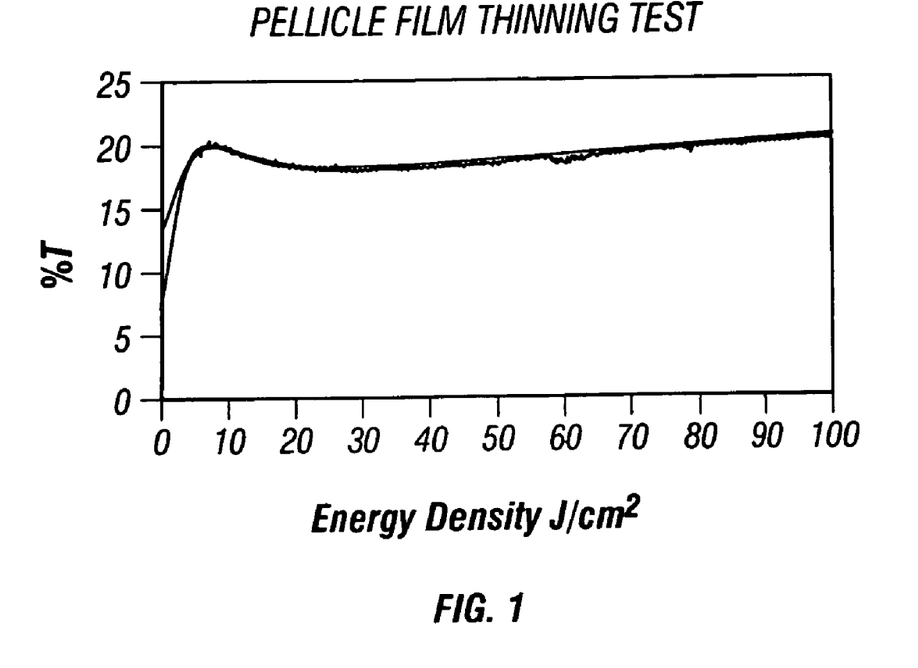
FIG. 1 is a plot showing the effect of exposure dose on transmission for CYTOP pellicles exposed to 157 nm irradiation.
Figure 2:
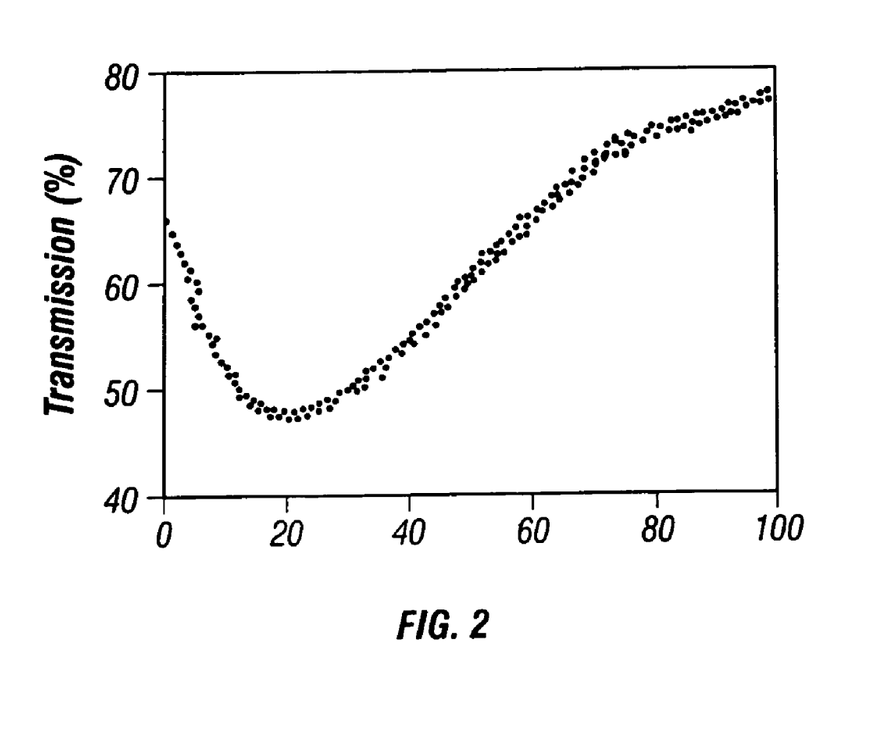
FIG. 2 is a plot showing the effect of exposure dose on transmission for Teflon AF (TAF) pellicle exposed to 157 nm irradiation.

Most pellicle polymers are useful at wavelengths of 193 nm but degrade rapidly at shorter wavelengths (e.g., at 157 nm). Irradiation of polymer pellicles causes pellicle structural degradation that depends on the irradiation dose and wavelength (or energy) of irradiation. For example, irradiation of pellicles made from CYTOP (an amorphous, soluble perfluoropolymer, the structure of which is depicted in Scheme 1) or Teflon AF polymer (polytetrafluoroethylene amorphous fluoropolymer, the structure of which is depicted in Scheme 3) with 157 nm in the range from 1 to 100 J/cm$^2$ causes a drop of transmission by as much as 100%. In addition, relying on the transmission properties of CYTOP or TAF at a particular irradiation dose is not practical. FIG. 1 shows the dependence of transmission on irradiation dose for CYTOP exposed to 157 nm irradiation. CYTOP shows a low transmission rate (~20%) and further shows that fluorination has little to no effect on transmission or durability of CYTOP. FIG. 2 shows the effect of exposure dose on transmission for TAF pellicle exposed to 157 nm. TAF shows a large transmission variation that is unacceptable for lithography processes. Low transmission and high variations in transmission, observed for CYTOP and TAF (FIGS. 1 and 2), respectively, are unacceptable for lithograph processes. A pellicle material that has sufficient durability or transmits a light in the ultraviolet region of shorter wavelength, particularly the vacuum ultraviolet (VUV) region such as a region of F2 laser beam of 157 nm is desirable.

Scheme 1

(Structure of the polymer CYTOP)

Furthermore, the dose should be uniform over the surface of a pellicle and wafer and should not change during the life of the pellicle. Deviations in transmission by less than 1% can typically be adjusted by an appropriate increase in exposure time (typically through automated adjustments) to take into account loss of transmission. For deviations above 1%, a process lithography engineer needs to make time consuming calculations. If the change in the pellicle transmission is not adequately corrected a change of critical dimensions (CD) on the exposed wafer will occur. This change depends, in part, on the resist thickness, absorption, type, and the like.

Fluorinated pellicle materials (such as CYTOP and Teflon AF) have provided some improvement in pellicle durability and resist critical dimensions at 193 nm. Incomplete fluorination, due to imperfect synthesis of CYTOP or Teflon AF, may result in reduced durability and transmission. In addition, Teflon AF may not be stoichiometrically fluorinated. Fluorination increases film durability due to the delay in the onset of photochemical darkening by irradiation. Incomplete fluorination, however, results in loss of transmission or in loss of pellicle durability, particularly at shorter wavelengths such as 157 nm, as shown in FIGS. 1 and 2.

Figure 3:
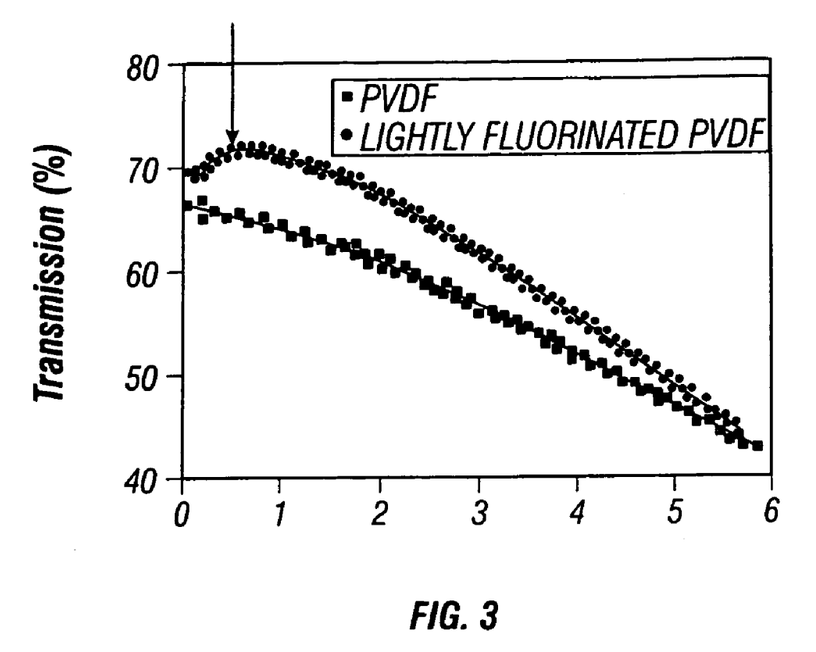
FIG. 3 is a plot showing a comparison of transmission between fluorinated polyvinylidiene fluoride (PVDF; 1,1-di-fluoro-ethylene) and PVDF exposed to 157 nm irradiation.
Figure 4:
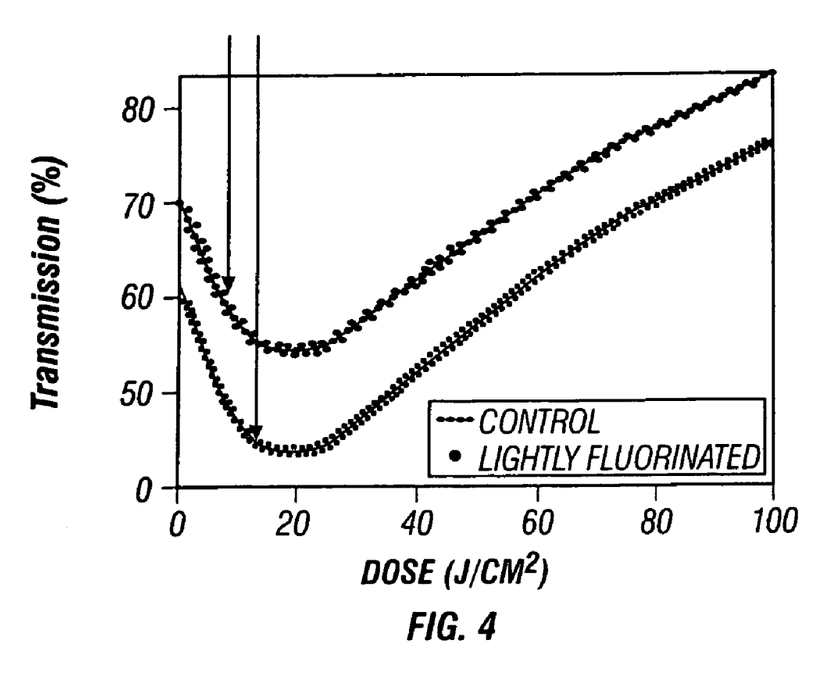
FIG. 4 is a plot showing a comparison of transmission between Teflon AF and perfluorinated Teflon AF exposed to 157 nm irradiation.

PVDF comprising two hydrogen and 2 fluorine atoms in its structure (see scheme 2) has less transmission and durability than fluorinated PVDF. Further fluorination of PVDF, improves both transmission and durability (see, FIG. 3). Similarly, fluorination improves transmission and durability of Teflon AF (TAF) (see scheme 3 and FIG. 4).

Scheme 2

(Structure of PVDF)

Scheme 3

Perfluoro(2,2-dimethyl-1,3-dioxole)
(Structure of Teflon AF)

Scheme 2 shows the structure of PVDF. Scheme 3 shows the structure of Teflon AF. Hydrogen atoms may remain during manufacture of Teflon AF due to, for example, incomplete synthesis such that not all critical hydrogens are replaced with fluorine to obtain a stoichiometrically proper Teflon AF. The disclosure provides perfluorinated Teflon AF.

Fluorinated PVDF having improved pellicle characteristics is provided. The disclosure provides fluorinated PVDF having improved optical transmission and durability compared to a PVDF polymer having repeating monomer units as shown in Scheme 2, particularly at shorter wavelengths than 193 nm (e.g., 157 nm). Further fluorination of PVDF can be obtained by ion beam fluorination, plasma beam fluorination and other methods as described herein.

These methods present a non-classical approach to polymer synthesis and pellicle modification. These techniques provide the advantage of modifying the surface in a controlled manner to increase durability and transmissibility of polymer materials.

Examples of pellicle polymers that can be further modified/fluorinated include polyfluoroolefins (e.g., tetrafluoroethylene, chlorotrifluoroethylene, or hexafluoroproprylene), perfluoro(alkyl vinyl ether) or a fluorine-containing unsaturated alicyclic monomer (e.g., scheme 3 herein). In scheme 3, trifluoromethyl groups are depicted, these may be substituted, independently, with a fluorine atom or a fluorine-containing organic group (e.g., perfluoralkyl group having from 1-2 carbon atoms). Other fluorinated polymers that can be modified are known in the art.

Typically fluorination of polymers is accomplished from the gas phase. However, it is difficult to accurately predict the percent fluorination in such a process. Moreover, the process is not effective for all polymer types. For example, fluorination in the gas phase of CYTOP may not improve the properties of CYTOP. Typically, CYTOP is fully fluorinated and therefore further attempts to fluorinate the polymer are ineffective. However, in some instances the methods disclosed herein are useful where, due to incomplete synthesis, full fluorination is not accomplished.

Post-formation fluorination of polymer materials useful as pellicles is provided by the disclosure. Physical and chemical modifications of existing pellicle materials and polymer materials contribute to the durability and optical properties of the pellicle materials and polymers, particularly at shorter wavelengths. As discussed above, the polymer surface characteristics (including end atoms) have a strong influence on the final product's physical and chemical properties. The present system discloses surface modification of polymers, while leaving the bulk intact.

An aspect describes improving pellicle and polymer characteristics such as durability and optical transmission by surface treatment techniques. Various surface modification techniques may include, for example, chemical treatment; flame treatment; coronas; low pressure plasmas; IR, UV, X-ray and gamma-ray irradiation; electron and ion beam bombardment; ozone exposure; plasma treatment; and others.

Ion beam techniques are useful as an effective method for modification and synthesis of diverse materials, including polymers. Ion beam processing of pellicle materials or polymers involves the modification of the surfaces of the pellicle materials or polymers by exposure to fluorinated ions. These fluorinated ions interact with the polymer material and are grafted to the material. Typically both —CF— and —CF$_2$— containing polymer materials can be generated by using F$^+$, CF$_3^+$, and non-mass-selected CF$_n^+$ ions. At sufficient energy, the nature of the fluorine-containing ion is not important as the ion acts only as a vehicle for delivery of reactive F atoms. Accordingly, ion beam techniques can be used to fluorinate or further fluorinate polymers useful as pellicles. For example, using ion beam techniques PVDF can be further fluorinated. Such techniques and resulting fluorinated products are highly durable and optically transmissive and serve as useful pellicles.

Figure 5:
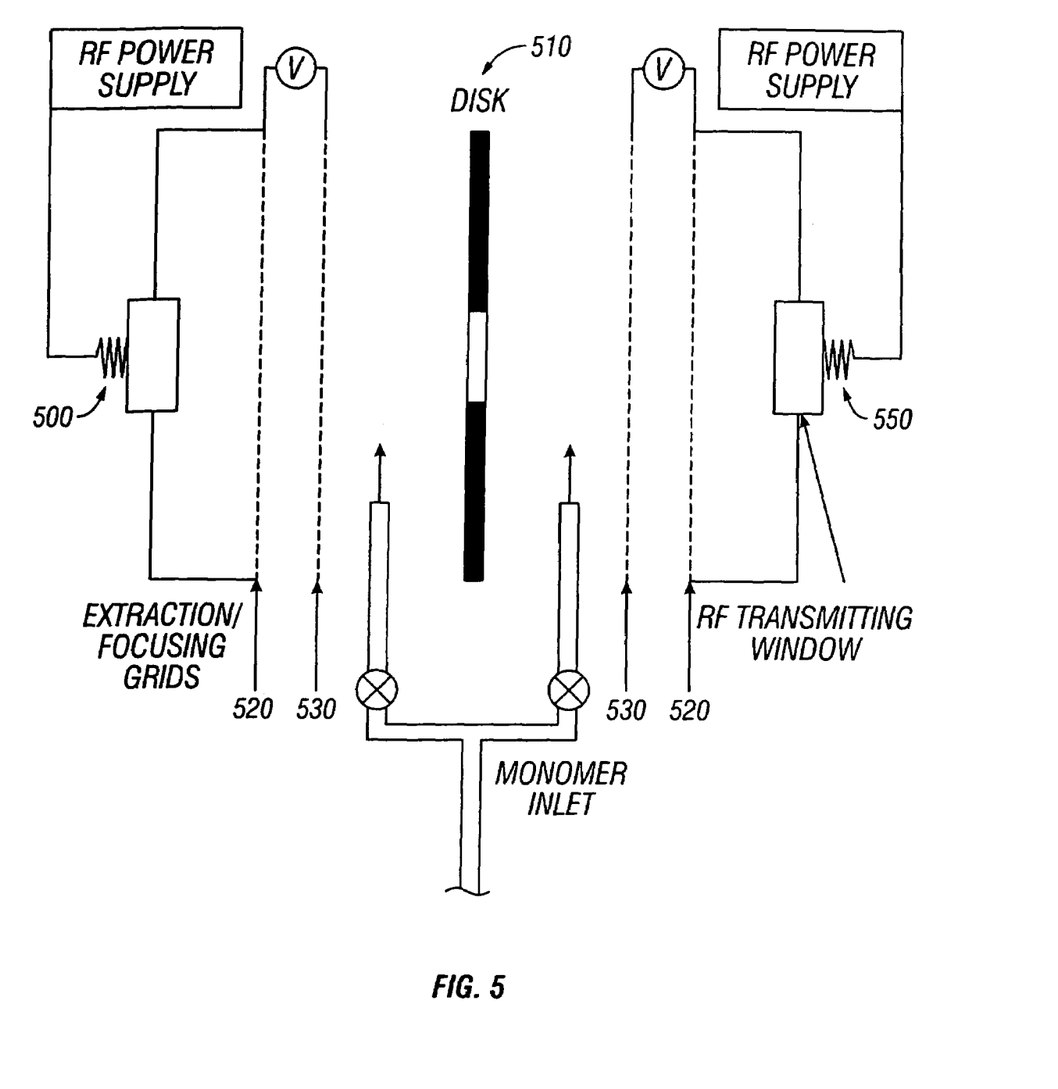
FIG. 5 is a schematic of an ion beam deposition chamber.

FIG. 5 is a schematic of a chamber for ion beam deposition. Two inductively coupled RF generated beam sources 500 and 550 are located in the chamber on two sides of a substrate 510. Argon is typically used to initiate plasma formation in the ion sources. The ion beam is formed by extracting the ions created in RF plasma using a dual grid 520 and 530, where the inner grid 530 is biased with a positive dc potential, and the outer grid 520 is biased with a negative dc voltage. A fluorocarbon or other fluoromonomer is introduced into the chamber through the gas inlets 560 and 570 between the ion sources and the substrate 510. The process forms a polymer film on the substrate. The properties of the substrate will depend on the partial pressure of the reactants, ion energy, ion flux and the like. Typically the ion beam is maintained following cutoff of the monomer gas inlet to the chamber for up to 1000 ms in order to completely react the monomer on the surface.

Plasma fluorination techniques can also be used. Plasma is formed of ionized gas or gas mixtures. Charged particles (ions or electrons) in the gaseous plasma accelerate in an electric field to the energies that are comparable or exceed bond energies of the pellicle or polymer surface. When the accelerated particle strikes the surface (i) the particle may be reflected, (ii) the particle impact can cause the target to eject electrons or atoms (sputtering), (iii) the particle may be trapped on the target (ion implantation or electron trapping), (iv) the particle impact may cause structural rearrangement of the surface (atom vacancies, atom displacement, changes in the crystal lattice, altering the stoichiometry), and/or (v) the particle impact generates a chemical modification of the surface if the plasma ions are chemically reactive.

Figure 6:
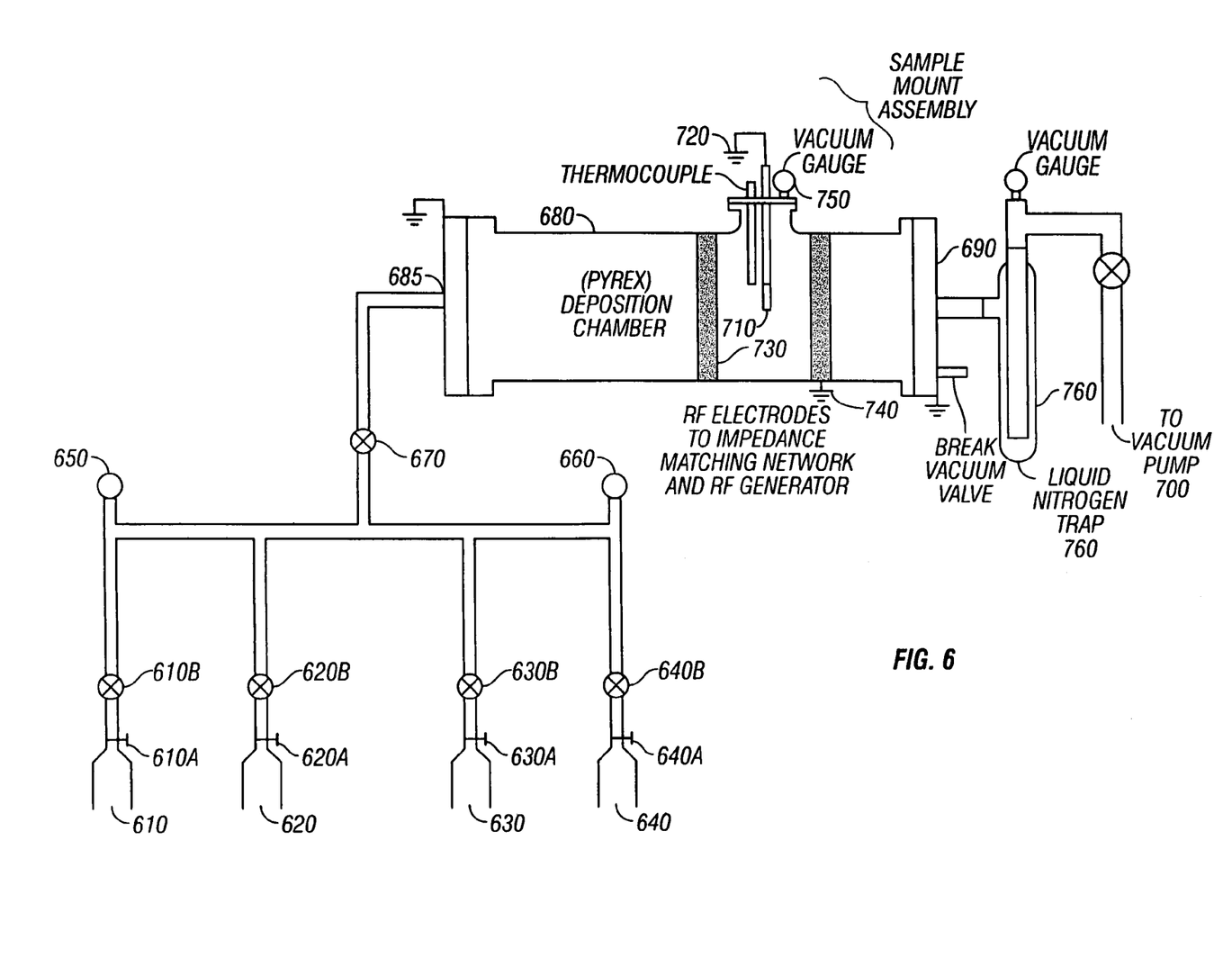
FIG. 6 is a schematic of a plasma deposition system useful for producing films in a discharge region.

FIG. 6 shows a schematic of a plasma deposition system for pellicle films produced in the discharge region. The plasma deposition system includes a generally cylindrical chamber 680 having a first port 690 for evacuating chamber 680 with a pump 700 and a second port 685 for introducing process gas, such as, for example, argon or reactive gases, from material containers including argon gas 610, TFE 620, PFP 630, PFHEP-1 640 each in fluid communication with metering valves 610a, 620a, 630a, and 640a, respectively, and in fluid communication with second port 685. Shut-off valves for each material container 610b, 620b, 630b and 640b may also be present. Pressure gauge 650, vacuum gauge 660 and main valve 70 are located in fluid communication with the material containers 610, 620, 630, and 640. Sample 710 is in contact with electrode 720. RF electrodes 730 and 740 are in associated with an RF generator and an impedance matching system.

In use the pellicle films are deposited on a substrate from RF induced glow discharge of fluorocarbon, or any other required monomer gas. The selected monomer with its flow regulated by a valve enters the deposition chamber before the plasma zone. The sample mount assembly, which includes a vacuum gauge 750 to monitor pressure near the substrate, can be rotated to provide horizontal adjustment. The plasma is maintained using an RF generator and an impedance matching system. The capacitive copper electrodes can be placed anywhere along the length of the deposition chamber 680, the inter-electrode distance is adjustable within 2.5 to 20 cm. Unreacted monomer and decomposition products flowing from the chamber are retained on a liquid nitrogen cooled trap 760. The flow and the vacuum are maintained using a two-stage vacuum pump; vacuum of about 1 mtorr is achievable.

Figure 7:
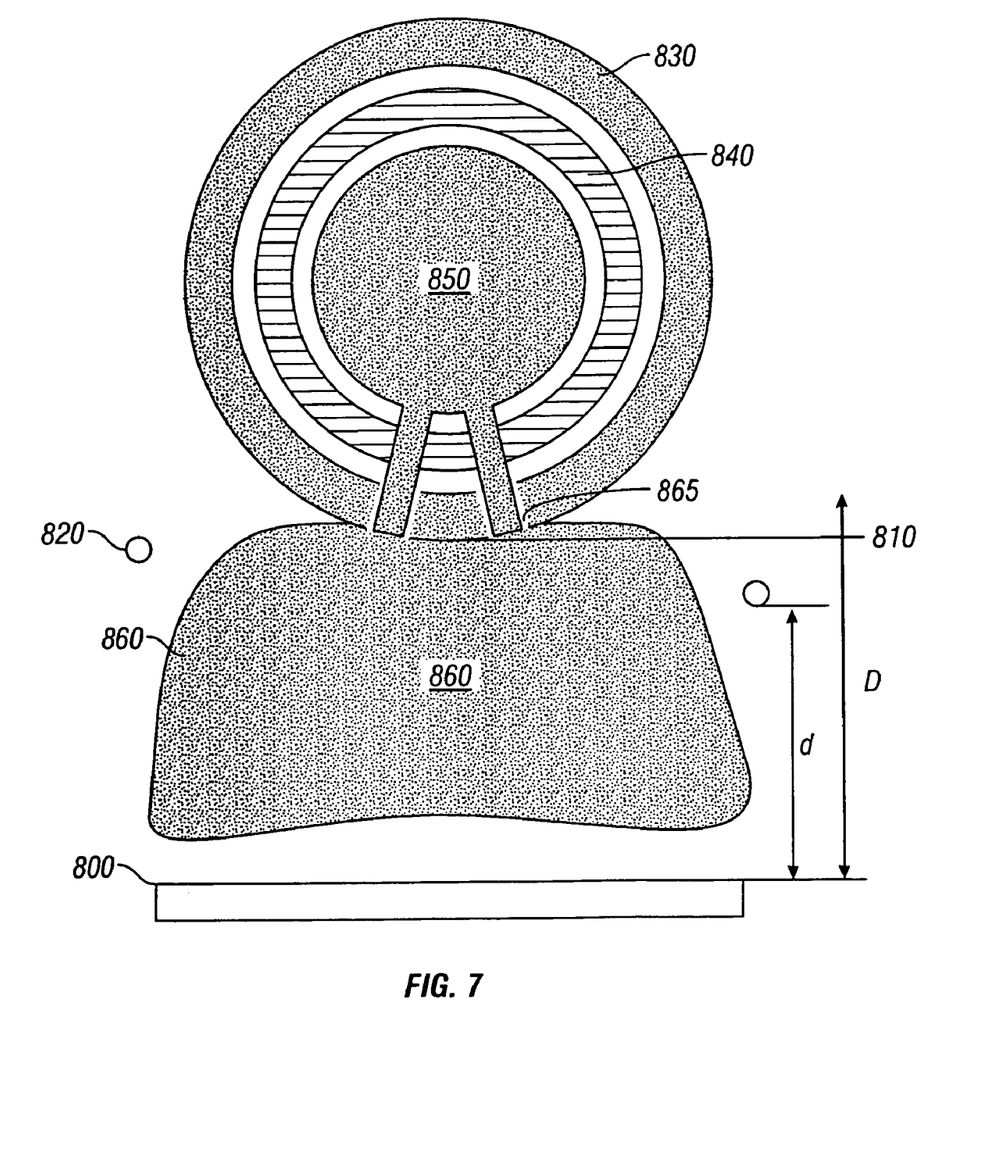
FIG. 7 is a schematic showing the cross-sectional view of a plasma source in remote high rate plasma polymerization.

FIG. 7 shows a cross sectional view of a plasma source in remote high rate plasma polymerization. Referring to FIG. 7, D is the distance between the substrate 800 and the source 810 and d is the distance between the substrate 800 and monomer-feeding ring 820. The cross-section shows the anode 830, the cathode 840 and primary plasma 850. The remote zone is generally depicted by reference 860.

Remote plasma polymerization source uses controlled high-density plasma. At an excitation frequency of above 13 MHz the hollow cathode discharge is formed. The cathode 840 is a tube open at both ends; it is fitted coaxially into a grounded cylinder, used as the anode 830. A spacing of approximately 2.5 mm is maintained using ceramic balls. The cathode 840 and anode 830 tubes are supplied with 2 rows of coaxial holes 855. Gas is fed directly into the cathode tube to run the primary discharge. The activated particles flow from the primary plasma 850 inside the cathode 840 via the holes 855 to the remote processing zone 860. Downstream the primary plasma outlet, the substrate 800 and monomer feeding system 820 are positioned. The substrate holder and feeding system can be moved up and down with respect to the plasma source outlet 810. As such, distances D and d, shown in FIG. 7, can be independently varied. At certain pressure levels, stable plasma discharge is achieved. A pump is used to control the pressure inside the chamber. Deposition is performed in two steps; first, desired monomer and oxygen flow are adjusted and, second, discharge is started.

Atomic layer deposition (ALD) can also be used to generate fluorinated pellicle materials or polymers. ALD involves formation of successive atomic layers on a substrate. Such layers may comprise an epitaxial, polycrystalline, amorphous material. ALD is sometimes referred to as atomic layer epitaxy, atomic layer processing, and the like. Other related techniques include, for example, chemical vapor deposition (CVD), pulsed CVD, and the like.

ALD includes exposing an initial substrate (e.g., a first monomer or polymer comprising fluorine) to a first chemical species (e.g., a monomer comprising fluorine) such that the chemical species is adsorbed onto the substrate. The chemical species forms a monolayer that is uniformly about one atom or molecule thick on the entire polymer surface.

A second chemical species (e.g., a second monomer that reacts with the first monomer) is provided to react with the first chemical species monolayer. These steps are repeated with exposure of the second species monolayer to the first species. In some cases, the two monolayers may be of the same species (e.g., to form a homopolymer). As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted).

Monomers useful in the methods disclosed herein may include, for example, $CFR_1=CR_2R_3$, wherein each of $R_1$, $R_2$, and $R_3$ are, independent of one another, a fluorine atom or a monovalent fluorine-containing organic group, or wherein $R_1$ and $R_2$ form a bivalent fluorine containing organic group and R3 is a fluorine atom or a monovalent fluorine containing organic group, or wherein $R_2$ and $R_3$ form a bivalent fluorine-containing organic group and $R_1$ is a fluorine atom or a monovalent fluorine-containing organic group.

During deposition of the various species, the substrate can be cleansed or purged between species. Such cleansing or purging techniques include, for example, contacting the substrate and/or monolayer with a carrier gas and/or lowering pressure to below the deposition pressure to reduce the concentration of a species contacting the substrate and/or chemisorbed species.

Chemical vapor deposition (CVD) is also useful to generate fluorinated polymers and pellicles. CVD includes a variety of more specific processes, including, but not limited to, plasma enhanced CVD (PECVD). CVD may use multiple species in the deposition chamber that react to form a deposited material (e.g., a highly fluorinated pellicle). Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

Surface polymer film content, uniformity, crystallinity, degree of cross linking, and thickness can vary depending on the deposition method used, the mixture of the gases in the reactor chamber, monomer gas partial pressure, partial pressure on inert gas in the chamber, total pressure, temperature in the chamber, voltage and frequency of the electric field, time deposition, geometry of the chamber, and position of the substrate.

Each method provided in this disclosure provides certain advantages that will be apparent to the person skilled in the art based upon this disclosure. For example, PECVD provides faster polymerization; remote high rate plasma polymerization separates plasma and deposition regions, excluding damage caused by bombardment of the substrate and growing film by energetic particles, low thermal heating of the substrate; ion beam deposition provides mechanically resistant films; ALD allows deposition of one individual polymer layer on another individual layer, which provides additional flexibility and accuracy of chemical composition of the film.

In order to achieve complete fluorination of the pellicle, application of an electric field and monopolymers in the gas phase may be used. Such techniques include plasma polymerization of the monomer gases, vacuum evaporation using electron beam, radio-frequency (RF)-induced plasma, plasma enhanced chemical vapor deposition (PECVD), ion beam deposition, remote high rate plasma polymerization, or atomic layer deposition (ALD).

Figure 8:
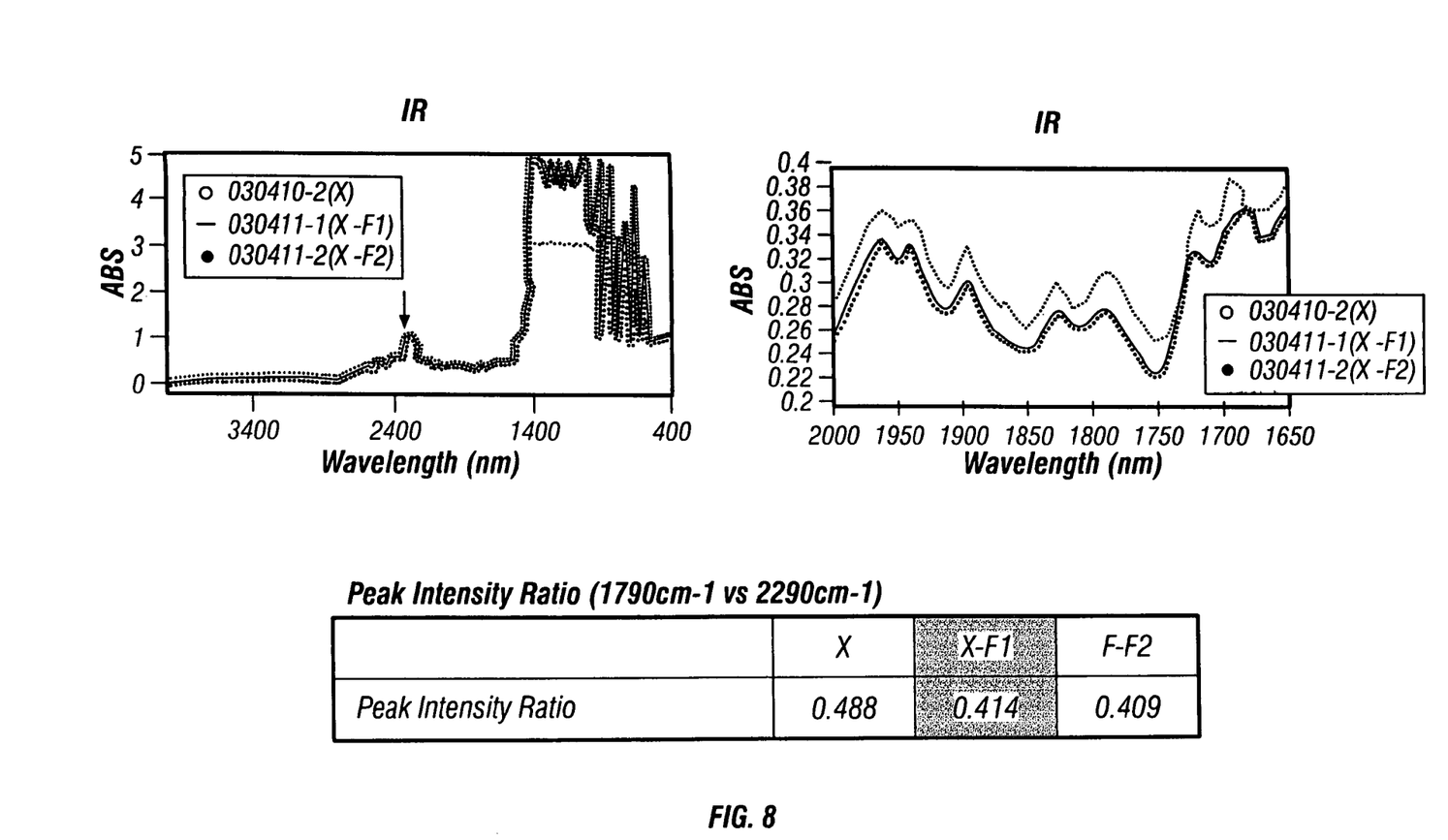
FIG. 8 is a plot showing the transmission at different wavelengths of fluorinated and non-fluorinated high molecular weight polymers.
Figure 9:
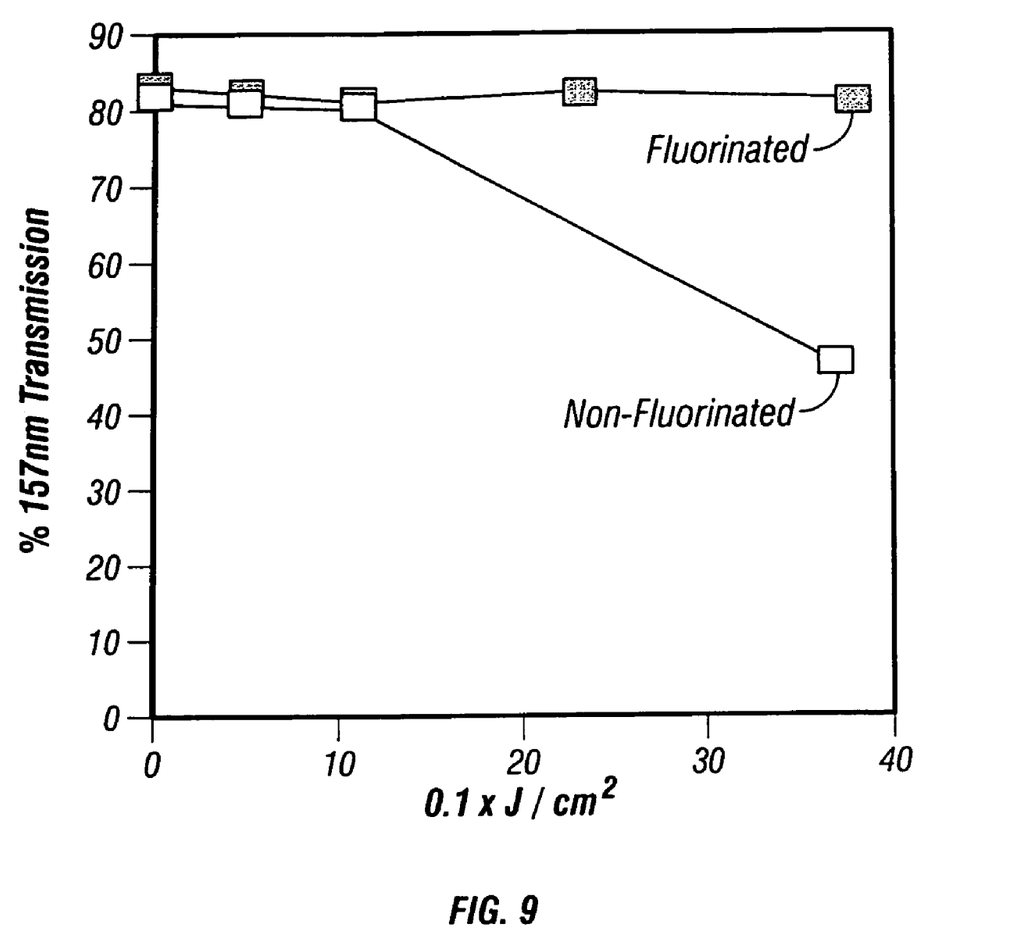
FIG. 9 is a plot showing the transmission at 157 nm for a fluorinated copolymer that comprises oxygen and fluorine atoms compared to a non-fluorinated copolymer.
Figure 10:
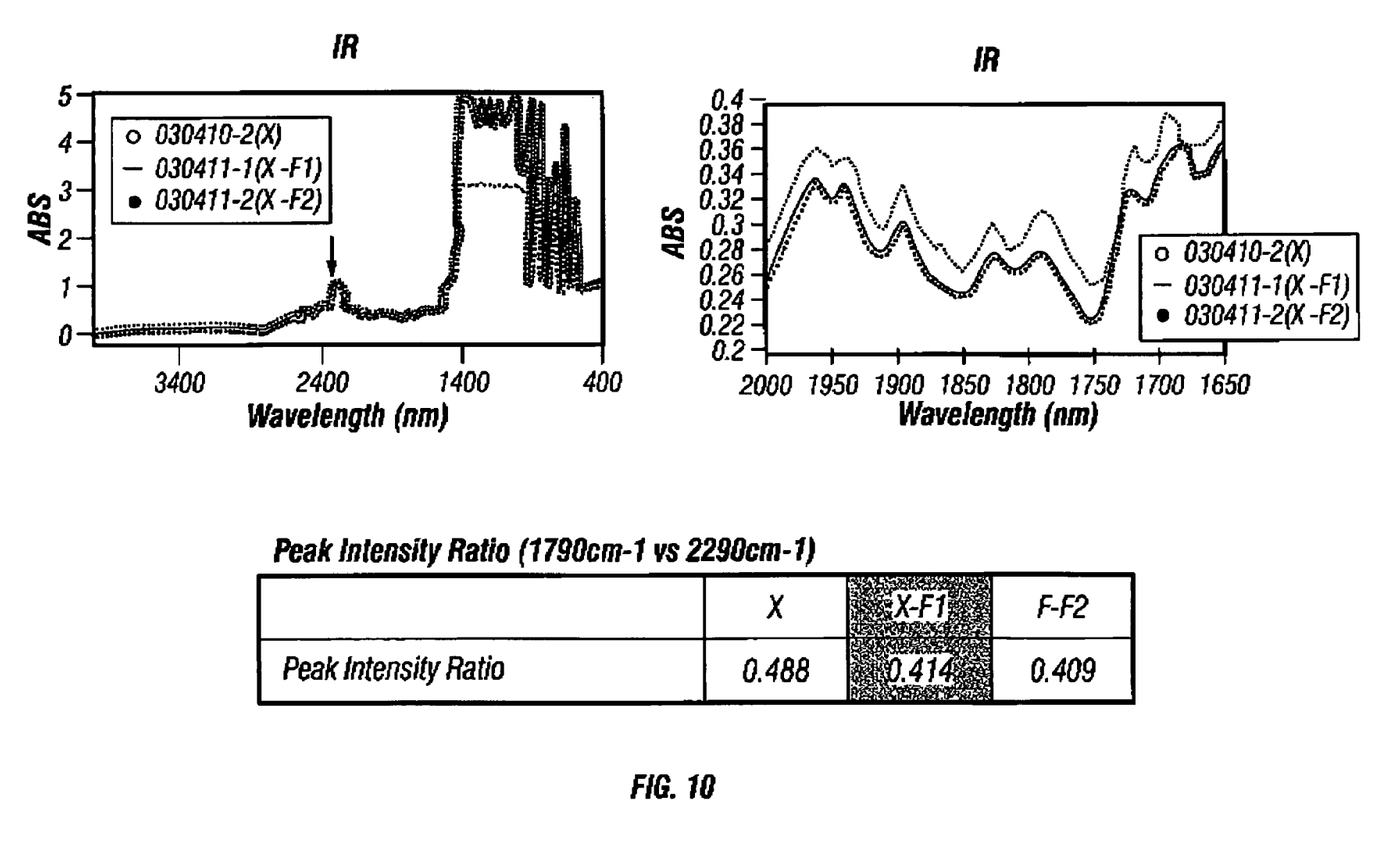
FIG. 10 shows a comparison of the FTIR spectra for fluorinated and non-fluorinated polymers that comprise oxygen and fluorine atoms.

The techniques described herein were used for successful fluoropolymer deposition. For example, fluorination improved optical properties, such as durability and transmission as shown in FIG. 8 for a polymer X comprising fluorine and oxygen atoms and does not contain hydrogen atoms. FIG. 8 shows transmission data at different wavelengths for a fluorinate and non-fluorinated high molecular weight polymer comprising oxygen and fluorine. Transmission in the wide wavelength range from 157 to 200 nm of a polymer increased after fluorination as shown in FIG. 8. Such fluorination changes the molecular structure of the polymers, as shown using FTIR and molecular weight tests in FIG. 10 and Table 1. FIG. 10 shows a comparison of the FTIR spectra for fluorinated and non-fluorinated polymers that comprise oxygen and fluorine atoms. Peaks at 2290 $cm^{-1}$ are assigned to hydrogen atoms, while peaks at 1790 $cm^{-1}$ are assigned to CF bonds. F1 and F2 designate lower and higher fluorination levels respectively. As fluorination level increases, peak intensity ratio decreases, which indicates an increase in fluorine content in the polymers. Increases in transmission are a result of replacement of non-reacted residual hydrogen atoms with fluorine atoms on both end groups and the main chain. Table 1 shows that as fluorination increases, intrinsic viscosity also increases.

TABLE 1

| Polymer | Intrinsic Viscosity |
| --- | --- |
| Non-fluorinated polymer | 1.454 |
| Fluorinated F1 | 1.681 |
| Fluorinated F2 | 1.691 |
| Fluorinated F3 | 1.679 |

Such techniques, however, are not limited to fluoropolymer applications. These general techniques can be used for deposition of polymer films of any composition.

A pellicle is typically produced by using a solution of the fluorine-containing polymer. Any solvent can be used so long as it dissolves the polymer. Common solvents include fluorine-containing solvents in which the polymer is highly soluble. For example, common solvents may include polyfluoroaromatic compounds such as perfluorobenzene, pentafluorobenzene and 1,3-bis(trifluormethyl)benzene. Polyfluorotrialkylamine compounds such as, for example, perfluorotribuylamine and perfluortripropylamine are also useful. In addition, polyfluorocycloalkane compounds such as perfluoroocyclohexane are useful as well as polyfluorocyclic ether compounds (e.g., perfluoro (2-butyltetrahydrofuran).

A pellicle membrane is formed from a layer of polymer on a substrate by any number of methods such as, for example, roll coating, casting, dip coating, spin coating, water casting, or die coating. The thickness of the pellicle is usually selected to be in a range from about 0.01 to 50 µm. Typical substrates may include silicon wafer, quartz glass or the like having a smooth surface.

Pellicles are typically manufactured using spin-on technology. As such, pellicle polymers combine high optical clarity at certain wavelengths and solubility. CYTOP and Teflon AF (TAF) are commonly used pellicle materials that possess high optical clarity and good solubility as a consequence of their amorphous morphology attributed to their cyclic structure. Coating from solution may be performed. The polymer is dissolved in a suitable solvent, the solution is spread out as a thin film on a substrate, e.g. by spin coating, and the solvent is allowed to evaporate. Standard procedures for casting or spin coating from solution have been described in the literature. A solvent of methyl ethel ketone (MEK), acetone, dimethylsulfoxide (DMSO), dimethylacetamide (DMA), dimethylformamide (DMF) or cyclohexanone may be used. The substrates may be a rigid inorganic surface such as glass, although flexible metallic or polymeric materials also have been used.

The surface modification(s) described herein can be performed while the polymer is layered on a substrate or may occur after the polymer film has been removed from the substrate.

A number of embodiments have been described. Nevertheless, it will be understood that various modifications may be made without departing from the spirit and scope of the disclosure. Accordingly, other embodiments are within the scope of the following claims.

What is claimed is:

1. A pellicle made by a process comprising:
    fluorinating a surface of an already-formed polymeric film using a technique that increases fluorine atoms on the film surface while leaving the bulk unchanged,
    wherein the fluorinated surface comprises a perfluorinated copolymer of tetrafluoroethylene and 2,2-dimethyl-1,3-dioxole, the copolymer perfluorinated to an extent characteristic of the pellicle film having been fluorinated after polymerization to eliminate hydrogen atoms from the polymer backbone in the fluorinated surface.

2. The pellicle polymer of claim 1, wherein the technique is selected from the group consisting of ion beam fluorination, plasma fluorination, atomic layer deposition, and remote plasma deposition.

3. The pellicle of claim 1, wherein the surface of the film is subjected, post formation of the film, to ion beam fluorination, plasma fluorination, atomic layer deposition, and/or remote plasma deposition to improve the film's optical properties, durability, and/or friction properties, wherein the optical properties, durability and/or friction properties are improved compared to a film that has not been subjected to ion beam fluorination, plasma fluorination, atomic layer deposition, and/or remote plasma deposition.

4. The pellicle of claim 3, wherein the optical properties and durability are improved at 157 nm compared to a film that has not been subjected to ion beam fluorination, plasma fluorination, atomic layer deposition, and/or remote plasma deposition.

5. A pellicle made by a process comprising fluorinating a surface of an amorphous fluoropolymer, post formation of the pellicle from the amorphous fluoropolymer, by atomic layer deposition, wherein the surface of the amorphous fluoropolymer is fluorinated while leaving the bulk unchanged, and wherein the treated surface comprises a molecular layer that includes the reaction product of a monolayer of a first chemisorbed species and a second species.

6. The pellicle of claim 5, wherein the process results in the surface deposition of fluorine containing groups.

7. The pellicle of claim 5, wherein one of the first chemisorbed species and the second species comprises $CFR_1=CR_2R_3$, wherein each of $R_2$, $R_2$, and $R_3$ are, independent of one another, a fluorine atom or a monovalent fluorine-containing organic group, or wherein $R_1$ and $R_2$ form a bivalent fluorine containing organic group and $R_3$ is a fluorine atom or a monovalent fluorine containing organic group, or wherein $R_2$ and $R_3$ form a bivalent fluorine-containing organic group and $R_1$ is a fluorine atom or a monovalent fluorine-containing organic group.

8. An apparatus comprising:
a polymeric pellicle film having a transmissivity suitable for lithography, the pellicle film comprising
a treated surface having a composition characteristic of exposure to a fluorinating process, and
a bulk having a composition characteristic of remaining unchanged by the fluorinating process,
wherein the treated surface comprises a perfluorinated copolymer of tetrafluoroethylene and 2,2-dimethyl-1,3-dioxole, the copolymer perfluorinated to an extent characteristic of the pellicle film having been fluorinated after polymerization to eliminate hydrogen atoms from the polymer backbone in the treated surface.

9. The apparatus of claim 8, wherein the treated surface has a composition characteristic of exposure to fluorinated ions.

10. The apparatus of claim 8, wherein the treated surface comprises implanted fluorinated species characteristic of plasma treatment with ions.

11. The apparatus of claim 8, wherein the treated surface comprises a molecular layer that includes the reaction product of a monolayer of a first chemisorbed species and a second species.

12. The apparatus of claim 11, wherein one of the first chemisorbed species and the second species comprises $CFR_1=CR_2R_3$, wherein each of $R_1$, $R_2$, and $R_3$ are, independent of one another, a fluorine atom or a monovalent fluorine-containing organic group, or wherein $R_1$ and $R_2$ form a bivalent fluorine containing organic group and $R_3$ is a fluorine atom or a monovalent fluorine containing organic group, or wherein $R_2$ and $R_3$ form a bivalent fluorine-containing organic group and $R_1$ is a fluorine atom or a monovalent fluorine-containing organic group.

13. The apparatus of claim 8, wherein the treated surface comprises a vapor deposited layer that is independent of the composition and surface properties of the bulk.

14. The apparatus of claim 8, wherein the bulk of the pellicle film comprises an amorphous fluoropolymer.

15. An apparatus comprising:
a polymeric pellicle film having a transmissivity suitable for lithography, the pellicle film comprising an amorphous fluoropolymer that comprises
a treated surface having a composition characteristic of exposure to a fluorinating process, and
a bulk having a composition characteristic of remaining unchanged by the fluorinating process,
wherein the amorphous fluoropolymer comprises a polymer having the structure

* * * * *